United States Patent [19]
Sung

[11] Patent Number: 5,879,986
[45] Date of Patent: Mar. 9, 1999

[54] METHOD FOR FABRICATION OF A ONE GIGABIT CAPACITOR OVER BIT LINE DRAM CELL WITH AN AREA EQUAL TO EIGHT TIMES THE USED MINIMUM FEATURE

[75] Inventor: Janmye Sung, Yang Mei, Taiwan

[73] Assignee: Vangaurd International Semiconductor Corporation, Hsin-Chu, Taiwan

[21] Appl. No.: 31,652

[22] Filed: Feb. 27, 1998

[51] Int. Cl.$^6$ .................................................. H01L 21/8242
[52] U.S. Cl. .......................................... 438/253; 438/672
[58] Field of Search .................................. 438/250–256, 438/393–398, 672–675

[56] References Cited

U.S. PATENT DOCUMENTS 5,100,838  3/1992  Dennison .
5,330,614  7/1994  Ahn .
5,688,713  11/1997  Linliu et al. .

*Primary Examiner*—Jey Tsai
*Attorney, Agent, or Firm*—George O. Saile; Stephen B. Ackerman

[57] ABSTRACT

A process for fabricating a high density, capacitor over bit line, DRAM cell, using 8F$^2$ technology, has been developed. The process features self-alignment of a tungsten bit line structure, to polycide word lines, and self-alignment of a capacitor node structure, to both tungsten bit lines, and to polycide word line structures. Self-alignment is accomplished by opening contact holes between polycide gate structures, and between tungsten bit line structures, which are coated with silicon nitride spacers, followed by filling with polysilicon plugs, which in turn contact underlying regions of the semiconductor substrate.

22 Claims, 10 Drawing Sheets

METHOD FOR FABRICATION OF A ONE GIGABIT CAPACITOR OVER BIT LINE DRAM CELL WITH AN AREA EQUAL TO EIGHT TIMES THE USED MINIMUM FEATURE

BACKGROUND OF THE INVENTION (1) Field of the Invention

The present invention relates to a process used to fabricate a cell for a dynamic random access memory, (DRAM), device, and more specifically to a fabrication process in which the area of the DRAM cell can be reduced using self-alignment processes for bit line contact and capacitor node structures.

(2) Description of the Prior Art

In order to satisfy demands for high density DRAM semiconductor chips, micro-miniaturization, or the use of sub-micron features, used for DRAM designs, are employed. The attainment of micro-miniaturazation, or sub-micron features, has been mainly accomplished by advances in specific semiconductor fabrication disciplines, as photo-lithography and dry etching. The use of more sophisticated exposure cameras, as well as the use of more sensitive photoresist materials, have allowed sub-micron images to be created in photoresist layers. In addition the development of more advanced dry etching tools and etch recipes, have allowed the sub-micron images in overlying photoresist layers to be successfully transferred to underlying materials, used in the creation of advanced semiconductor devices.

However to achieve DRAM cell densities of 1 gigabit, or greater, new design, in addition to process enhancements, may be needed. Currently the area needed for a DRAM cell is equal to between about eight to 12 times the minimum feature used, sometimes referred to as $8F^2$ or $12F^2$. However the decreasing feature dimensions, used with an $8F^2$ technology, place stringent limitations on specific photo-lithographic alignment steps. For example any mis-alignment, occurring with the opening of the bit line contact hole, or the storage node hole, can result in unwanted leakages or shorts, when designing to a $8F^2$ technology.

This invention will describe a fabrication process for a DRAM cell, capable of densities of 1 gigabit or greater, in which $8F^2$ technology is used, but featuring self-alignment procedures, specifically for the bit line, and storage node structures, thus minimizing the mis-alignment possibility that can occur when using non self-aligned counterparts. This invention will also feature the use of polysilicon plugs, when used in combination with the self-aligned procedures, enhance the $8F^2$ technology used for high density DRAM cells. Prior art such as Rosner, in U.S. Pat. No. 5,600,162, describe a DRAM cell layout, however that DRAM layout does not offer the self-alignment features, or does it offer the process used to create a high density DRAM cell, using the novel self-alignment processes.

SUMMARY OF THE INVENTION

It as an object of this invention to create a high density DRAM cell, consuming an area equal to about eight times the minimum design feature.

It is another object of this invention to create a capacitor over bit line, (COB), DRAM cell in which the bit line contact is self-aligned to word line structures.

It is still another object of this invention to pattern the DRAM cell, transistor sidewall spacer, after creation of a self-aligned contact, (SAC), opening, and after formation of sidewall spacers for the peripheral devices.

It is yet another object of this invention to form two different size, SAC structures, both self-aligned in either the X or Y direction, using unpatterned silicon nitride as etch stops.

It is still yet another object of this invention to open a bit line contact on a shallow trench isolation, (STI), region, and to form a straight bit line structure on the top of STI regions, across DRAM cells.

It is still yet another object of this invention to create a DRAM cell in which the capacitor node contact is self-aligned to both bit line structures, and to the word line structures.

In accordance with the present invention a method for creating a DRAM cell, using an $8F^2$ technology, featuring self-alignment of bit lines contacts to word lines, and self-alignment of capacitor node contacts to bit lines and word lines, has been developed. After formation of a P well regions, and of a deep, N type layer, formed in the semiconductor substrate to isolate the subsequent high density DRAM cell from the underlying substrate, and after creation of insulator filled shallow trench isolation regions, (STI), silicon nitride capped, polycide, (metal silicide on polysilicon), gate structures are formed on a thin gate insulator layer. After deposition of a silicon nitride layer, and a boro-phosphosilicate, (BPSG), a first set of self-aligned contacts, (SAC), are opened in the boro-phosphosilicate, (BPSG) layer, exposing a silicon nitride layer, overlying a region of the semiconductor substrate, to be used for subsequent capacitor node contacts, while a second SAC is also opened in the BPSG layer, exposing a silicon nitride layer overlying both an N type region, in the semiconductor substrate, and a region of STI, to be used for a subsequent bit line contact. After formation of silicon nitride spacers, exposed in the SAC openings, a large angle, N type ion implantation procedure is employed to create N type regions in exposed semiconductor regions. Polysilicon plugs are next formed in both sets of contact openings, self-aligned to adjacent polycide gate structures, then followed by the deposition of a first silicon oxide layer. After opening a via hole in the first silicon oxide layer, exposing a region of the first polysilicon plug, located in the second SAC opening, in a region in which the first polysilicon plug resides on a STI region, a metal layer is deposited and patterned to create a bit line structures, with a specific bit line structure contacting the first polysilicon plug, and with the first polysilicon plug being self-aligned to underlying polycide gate structures, or word lines.

After deposition of a silicon nitride layer, and creation of silicon nitride spacers on the sides of the bit line structures, a second silicon oxide layer is deposited. Another SAC opening is next created between bit line structures, in the second silicon oxide layer, in a silicon nitride layer, and in the first silicon oxide layer, exposing a second polysilicon plug, overlying an N type region in the semiconductor substrate, between polycide gate structures. A third polysilicon plug is formed in the SAC opening, overlying and contacting the second polysilicon plug, thus self-aligned to the polycide word lines, and self-aligned to the silicon nitride lined, bit line structures. A storage node structure, is next formed, on the top surface of the second silicon oxide layer, and contacting the third polysilicon plug, in the fourth contact hole. Formation of a capacitor dielectric layer, and of a capacitor plate, complete the capacitor structure, self-aligned to both silicon nitride lined, polycide word lines, and to silicon nitride lined, bit line structures, via the use of polysilicon plugs.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The fabrication process used to create a high density DRAM cell, using a $8F^2$ technology, and featuring self-alignment of the bit line contact, to polycide word lines, as well as self-alignment of a capacitor node contact, to both polycide word lines, and to bit line structures, will now be covered in detail. The DRAM device described in this invention is comprised of N channel transfer gate transistors. If desired, this invention can be used to create a DRAM cell, comprised of P channel transfer gate transistors. This can be accomplished by creating an N well region, in the P type semiconductor substrate, and creating P type source and drain regions, in the semiconductor substrate, between polycide gate structures.

Figure 1A:
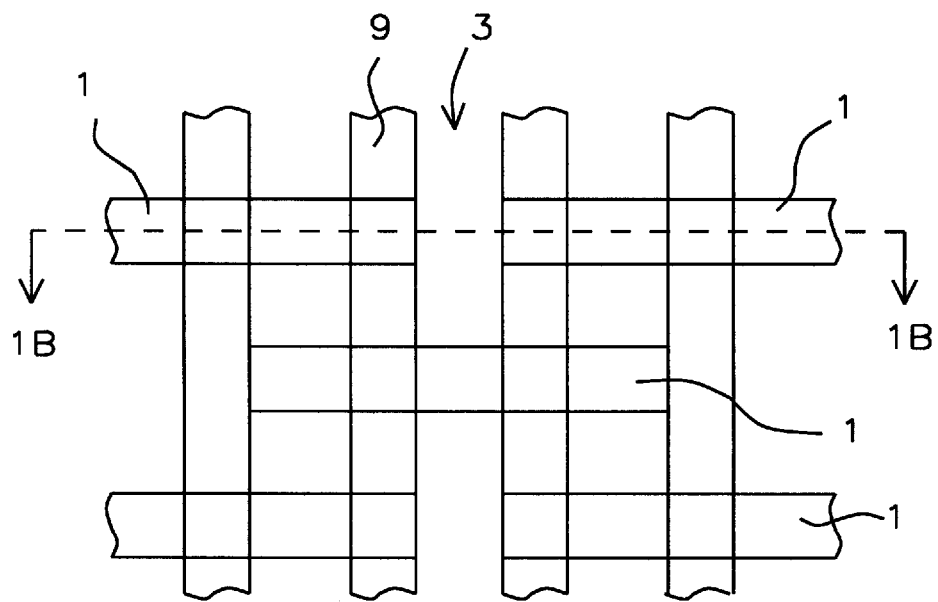
FIGS. 1A, 3A, 6A, and 9A, which schematically show the top view of the DRAM cell, at critical stages of fabrication.
Figure 1B:
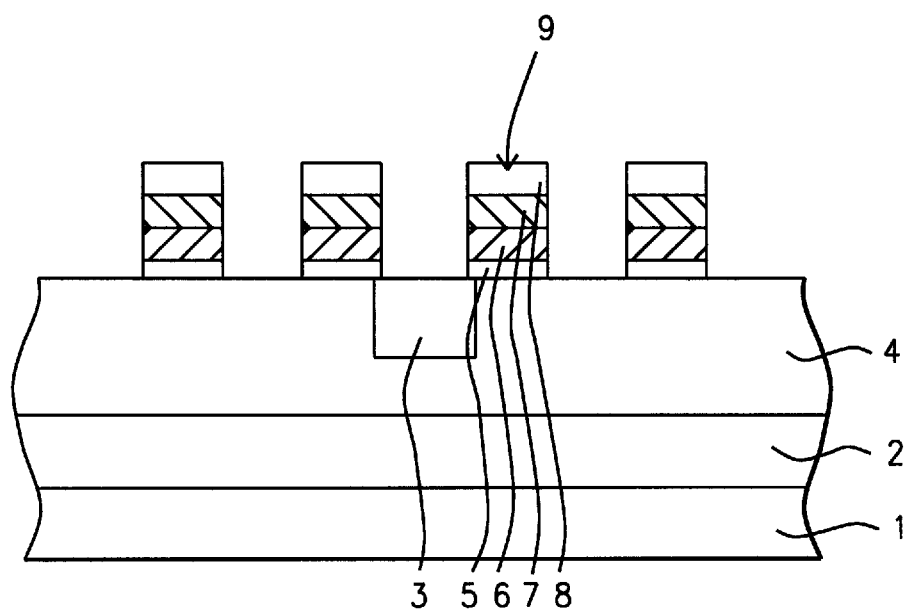
FIGS. 1B, 2, 3B, 3C, 4, 5, 6B, 6C, 6D, 7, 8, 9B, and 9C, which schematically, in cross-sectional style, illustrate key stages of fabrication used to construct the DRAM cell.

FIG. 1A, schematically shows a top view of a DRAM cell, at a stage where insulator filled, shallow trench isolation, (STI), regions 3, have been formed in semiconductor substrate 1. Polycide gate structures, or word lines 9, are also shown, normal in direction to regions of semiconductor substrate 1, not occupied with STI regions 3. FIG. 1B, schematically shows the cross-sectional view of the DRAM cell, at this stage of fabrication. The P type, single crystalline silicon substrate 1, having a <100> crystallographic orientation, is shown in FIG. 1A. A P well region 4, used to supply the needed P type dopant concentration for subsequent N channel, metal oxide semiconductor field effect transistors, (MOSFET), as well as deep N type region 2, used to isolate the DRAM cell from semiconductor substrate 1, are formed using conventional photolithographic and ion implantation. procedures. P well region 4, is formed via a boron ion implantation procedure, while deep N type region 2, is formed via a high energy phosphorous ion implantation procedure. In addition, a threshold adjust, ion implantation procedure, using implanted boron ions, is also performed in the DRAM cell region, and used to alter the channel doping characteristics near the surface of semiconductor substrate 1. The threshold adjust region, created in DRAM cell, is not shown in the drawings.

After removal of the photoresist shapes, used for creation of P well region 4, and for the creation of deep N type region 2, STI regions 3, are formed. This is accomplished by depositing a silicon nitride layer, on an underlying silicon oxide layer, followed by forming a photoresist masking shape, on the underlying silicon nitride layer, and using an anisotropic reactive ion etching, (RIE), procedure, to create the desired shallow trenches in silicon nitride, silicon oxide, and semiconductor substrate 1. The depth of the shallow trenches, in semiconductor substrate 1, is between about 3000 to 5000 Angstroms. After removal of the photoresist masking shape, via plasma oxygen ashing and careful wet cleans, a silicon oxide layer is deposited, via plasma enhanced chemical vapor deposition; (PECVD), or low pressure chemical vapor deposition, (LPCVD), procedures, completely filling the shallow trenches. A chemical mechanical polishing, (CMP), procedure is used to remove unwanted silicon oxide, from the top surface of the silicon nitride layer, followed by the removal of silicon nitride, and silicon oxide layer, resulting in insulator filled, STI regions 3, schematically shown in the top view in FIG. 1A. and in cross-sectional view of FIG. 1B.

Creation of polycide gate structures 9, is next addressed. A thin silicon dioxide layer 5, is thermally grown in an oxygen-steam ambient, to a thickness between about 50 to 70 Angstroms, to be used for the gate insulator layer, of the DRAM cell. Next a polysilicon layer 6, is deposited via LPCVD procedures, to a thickness between about 500 to 1000 Angstroms. Polysilicon layer 6, can be doped N type, during an in situ doping, deposition procedure, or polysilicon layer 6, can be deposited intrinsically and doped using either phosphorous or arsenic, ion implantation procedures. After deposition of a titanium nitride layer, not shown in FIG. 1A, a titanium disilicide layer 7, is formed on polysilicon layer 6, at a thickness between about 800 to 1200 Angstroms, via a LPCVD procedure. An overlying layer of silicon nitride 8, is next deposited again via PECVD or LPCVD procedures, to a thickness between about 2000 to 2500 Angstroms. Polycide gate structures 9, and gate structures formed for peripheral devices, (not shown in the drawings), are then simultaneously formed via photolithographic and anisotropic RIE procedures, using $CHF_3$ as an etchant for silicon nitride layer 8, and using $Cl_2$ as an etchant for titanium disilicide layer 7, for the titanium nitride layer, and for polysilicon layer 6. Polycide gate structures, or polycide word lines 9, shown schematically in FIG. 1B, have a sheet resistance between about 2–4 ohms/square.

Figure 2:
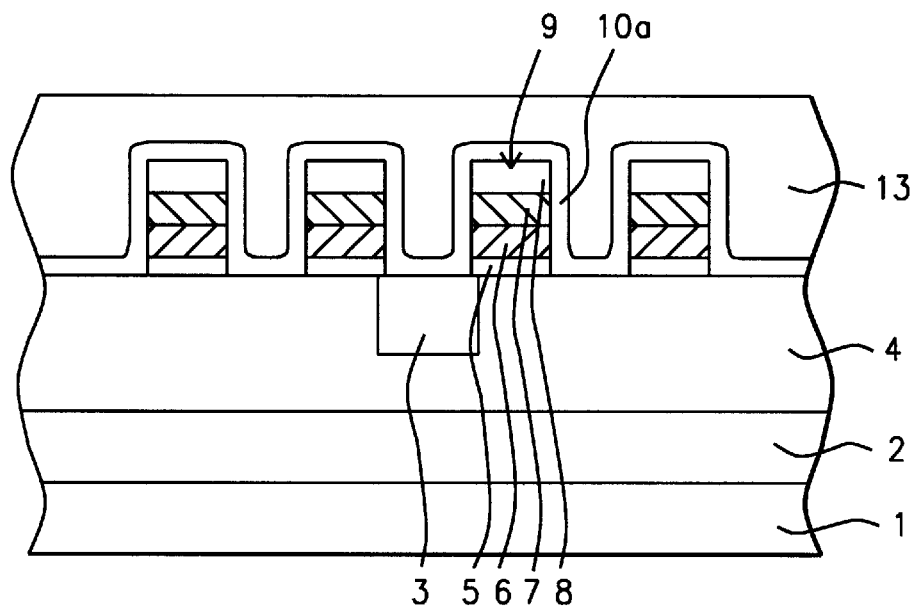

After removal of photoresist shapes, used as an etch mask for polycide gate formation, a silicon nitride layer 10a, is deposited, via an LPCVD or a PECVD procedure, to a thickness between about 600 to 800 Angstroms. Unlike previous processes used for logic or memory devices, silicon nitride spacers are not formed at this stage of fabrication. A deposition of a boro-phosphosilicate, (BPSG), layer 13, is performed via LPCVD or PECVD procedures, to a thickness between about 5000 to 8000 Angstroms. BPSG layer 13, contains between about 3 to 5% $B_2O_3$, and between about 4 to 6% $P_2O_5$. A chemical mechanical polishing, (CMP), procedure, is next employed for planarization purposes, creating a smooth top surface topology, for BPSG layer 13, schematically illustrated in FIG. 2.

Figure 3A:
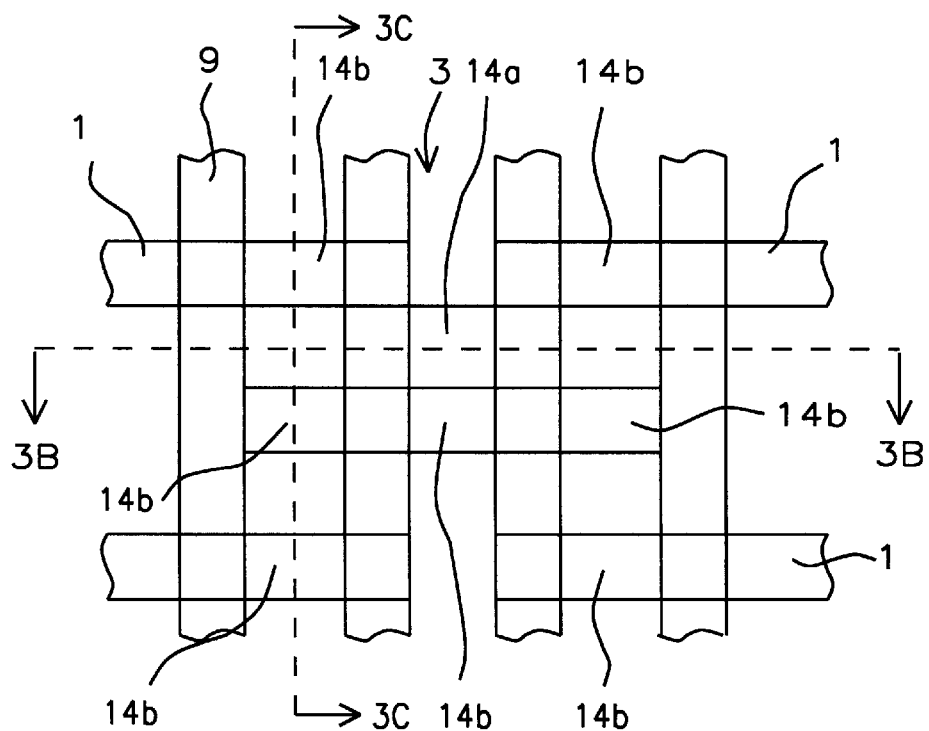
Figure 3B:
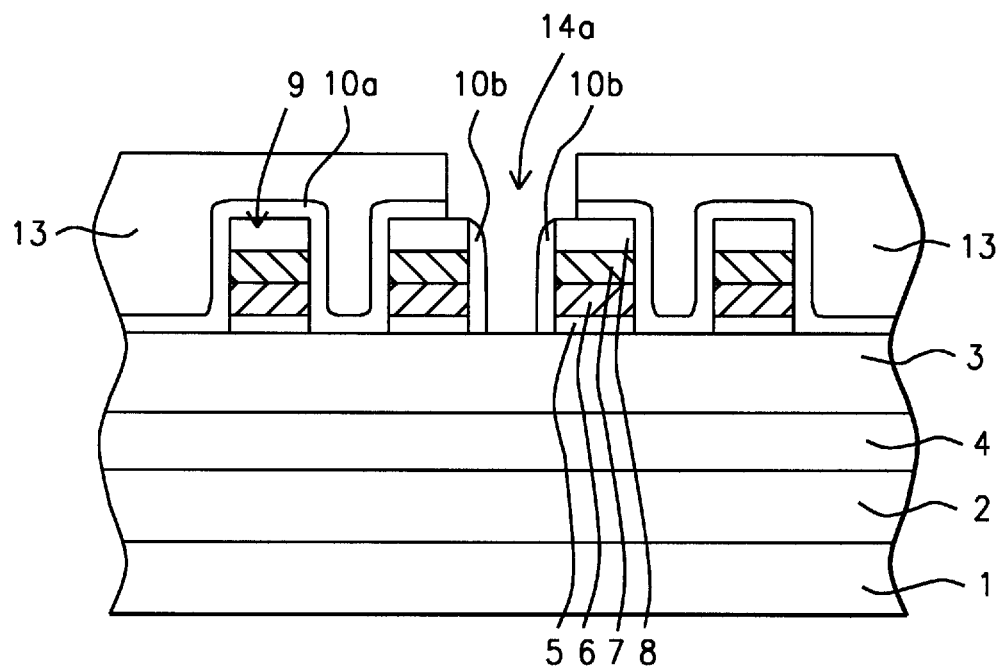
Figure 3C:
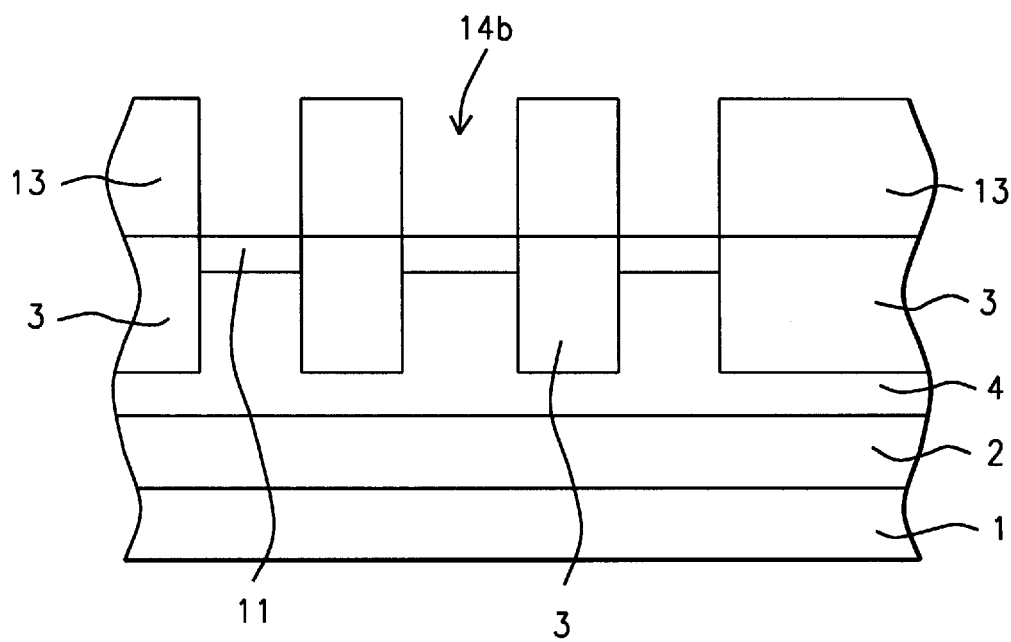

FIGS. 3A, 3B, and 3C, address the formation of self-aligned contact, (SAC), holes, in BPSG layer 13, to be used to allow subsequent self-aligned contact of bit line, and capacitor node structures, to be made to regions of semiconductor substrate 1. FIG. 3A, schematically shows a top view with SAC openings 14b, exposing silicon nitride layer 10a, overlying N type region 4, while SAC opening 14a, exposes silicon nitride layer 10a, overlying an STI region 3. The SAC opening, comprised of a SAC 14A, component, and a SAC 14B, component, in the center of the DRAM cell, will be used for a subsequent bit line structure, with a subsequent polysilicon plug filling this SAC opening. Part of the polysilicon plug will contact N type region 11, in the SAC 14B, component, while the other part of the polysilicon plug, in SAC 14A, component, will overlay an STI region, and will be used for contact to the polysilicon plug by a subsequent, overlying bit line structure. Therefore the bit line contact will not directly overlay a region of the semiconductor substrate. The SAC openings shown schematically, in cross-sectional style, for FIGS. 3B and 3C, are created in BPSG layer 13, via conventional photolithographic and anisotropic RIE procedures. A RIE etchant, $C_2F_8$—$CF_4$—$CHF_3$, is used to selectively remove BPSG layer 13, from silicon nitride layer 10a, exposed in SAC opening 14A, shown in FIG. 3B, and SAC openings 14B, shown schematically in FIG. 3C. Silicon nitride layer 10a served as an etch stop for the SAC opening procedure, protecting both gate structures and STI regions. This allows the SAC concept to be achieved, via use of a photoresist masking shape, with an opening between about 0.20 to 0.22 uM in width, larger in width than the space between polycide gate structures, which is between about 0.18 to 0.20 uM, and therefore resulting in the SAC openings, which allow self-alignment of subsequent contact structures, to polycide gate structures to be achieved. After the BPSG opening has been completed silicon nitride spacers 10b, are formed on polycide gate structures, exposed in the SAC openings, via an additional anisotropic RIE procedure, using $CHF_3$ as an etchant, and selectively, and anisotropically, removing silicon nitride from the surface of semiconductor substrate 1. With the masking photoresist shape, still in place, a ion implantation procedure, of arsenic or phosphorous, is performed, at an energy between about 30 to 50 KeV, at a dose between about 4E12 to 8E12 atoms/cm$^2$, and at an implant angle between about 30° to 45°, creating N type region 11, in exposed regions of the semiconductor substrate, including regions under silicon nitride spacers 10b. FIG. 3B, shows the SAC 14A, component, with silicon nitride spacers 10b, opened to STI region 3, while FIG. 3C, shows the SAC 14B, component, with silicon nitride spacers 10b, exposing N type region 11, in semiconductor substrate 1.

Figure 4:
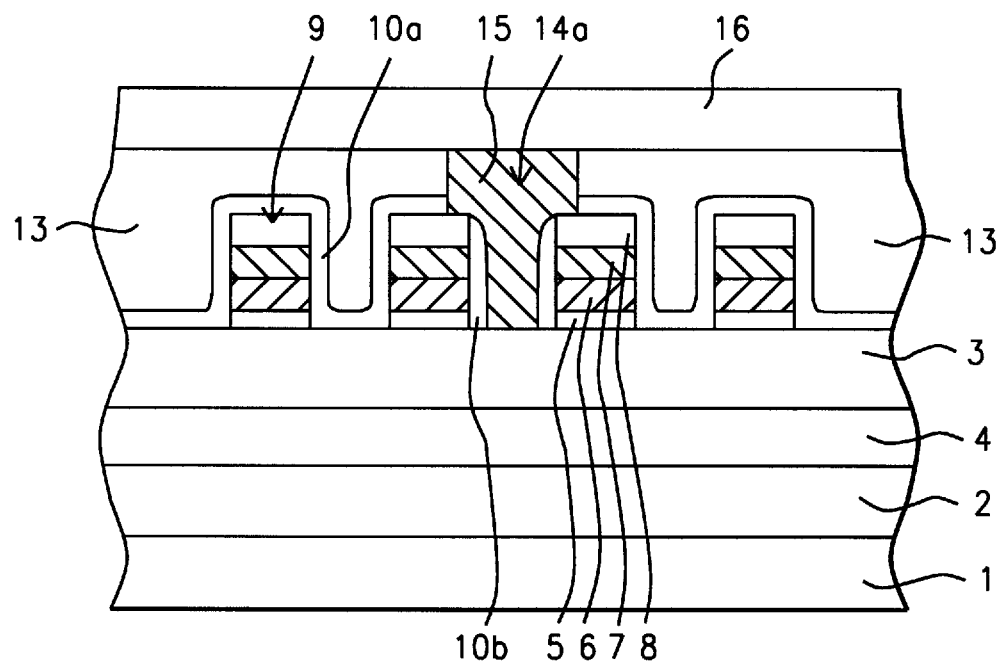
Figure 5:
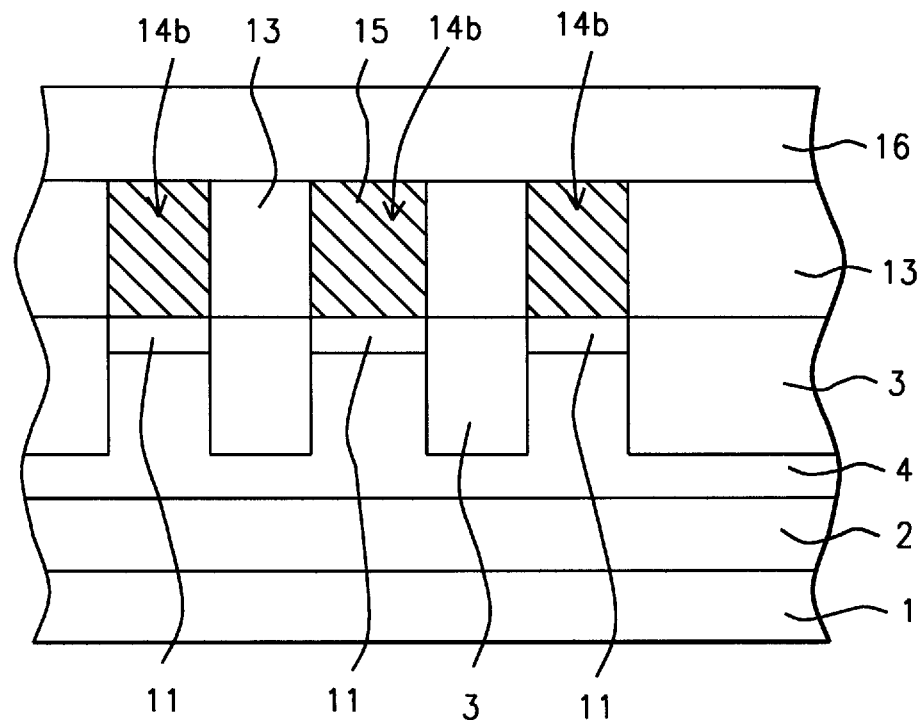
Figure 6A:
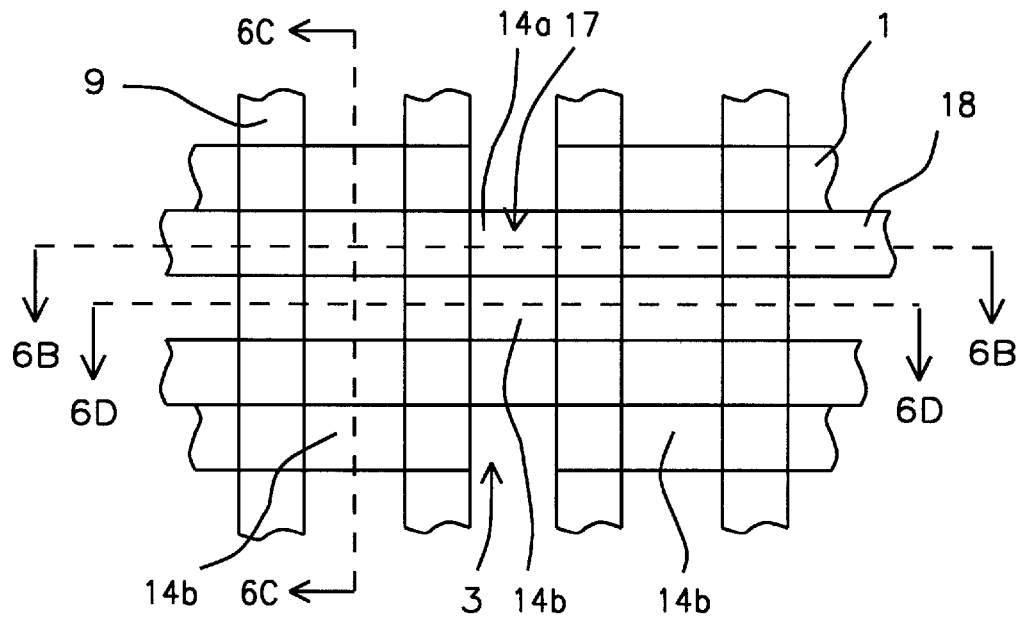

After removal of photoresist masking shapes, used to create the SAC openings, again using plasma oxygen ashing and careful wet cleans, a polysilicon layer is deposited, using LPCVD procedures, to a thickness between about 4000 to 6000 Angstroms. The polysilicon layer can be in situ doped N type, during deposition, or the polysilicon layer can be deposited intrinsically and then doped via N type, ion implantation procedures. A CMP procedure is next used to completely remove unwanted regions of the polysilicon layer from the top surface of BPSG layer 13, resulting in polysilicon plug 15, on STI region 3, located between, and self-aligned to, silicon nitride lined, polycide gate structures 9, in SAC opening 14A, shown schematically in FIG. 4. The same CMP procedure results in additional polysilicon plugs 15, on N type region 11, in SAC openings 14B, shown schematically in FIG. 5. Polysilicon plugs 15, in SAC opening 14B, are again between, and self-aligned to, polycide gate structures 9, however the direction of the cross-section, used for FIG. 5, does not show this self-alignment feature. However it can be seen in top view schematic of FIG. 6A. A first silicon oxide layer 16, is next deposited, via LPCVD or PECVD procedures, to a thickness between about 3000 to 5000 Angstroms. This is schematically shown in FIGS. 4, and 5.

Figure 6B:
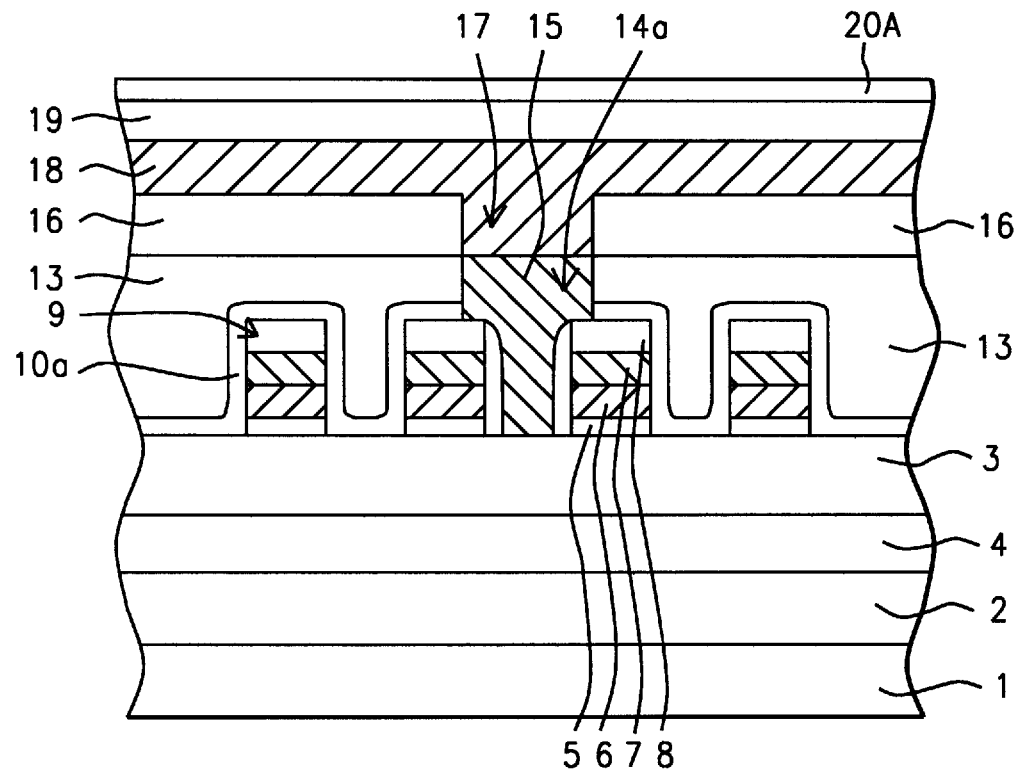
Figure 6C:
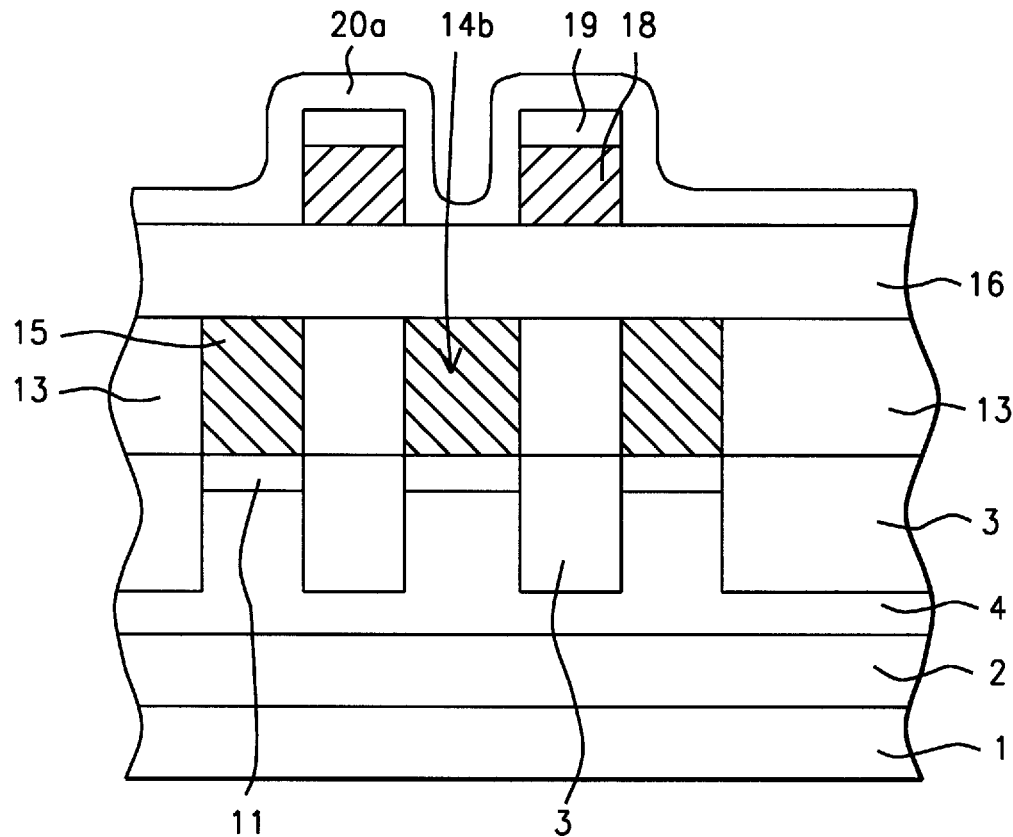
Figure 6D:
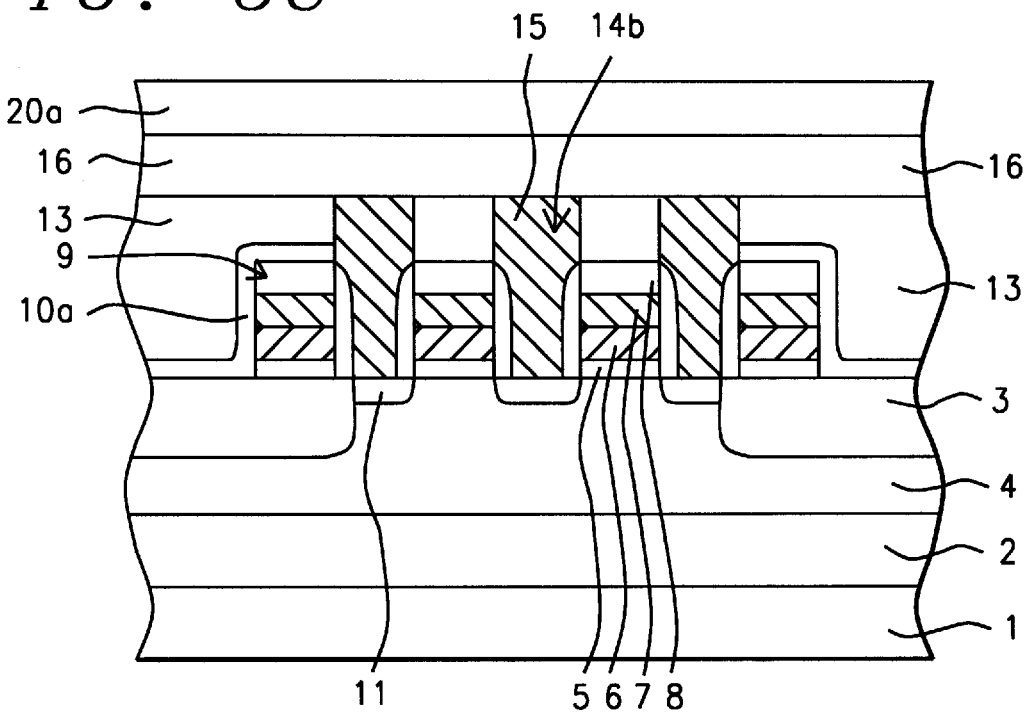

Conventional photolithographic and anisotropic RIE procedures, using $CHF_3$ as an etchant, are used to open contact hole 17, in first silicon oxide layer 16, exposing the top surface of polysilicon plug 15, in a region in which polysilicon plug 15, overlays STI region 3, in SAC opening 14A. This is shown schematically in FIG. 6A, and in cross-sectional style in FIG. 6B. A tungsten layer is next deposited using R.F. sputtering, to a thickness between about 800 to 1200 Angstroms, followed by the deposition of silicon nitride layer 19, via a PECVD procedure, and to a thickness between about 1500 to 2500 Angstroms. Patterning of silicon nitride layer 19, and of tungsten layer 18, is accomplished via conventional photolithographic and anisotropic RIE procedures, using $Cl_2$ as an etchant, creating tungsten bit line 18, capped with silicon nitride layer 19, shown in FIG. 6A, for the top view of the DRAM cell, and shown for cross-sectional views, in FIGS. 6B, 6C, and 6D. Bit line structure 18, with a sheet resistance between about 0.75 to 1.25 ohm/square, shown in FIG. 6B, is self-aligned to polycide gate, or word line structures, 9, via direct contact to underlying polysilicon plug 15, which in turn contacts N type region 11, in SAC opening 14B. However the contact of tungsten bit line 18, to polysilicon plug 15, occurs in a region in which polysilicon plug 15, overlays STI region 3, in SAC opening 14A. After removal of the masking photoresist shape, via plasma oxygen ashing and careful wet cleans, another silicon nitride layer 20a, is deposited using a PECVD procedure, to a thickness between about 300 to 500 Angstroms, encapsulating silicon nitride capped, tungsten bit line structure 18, shown schematically in FIG. 6C. The space between tungsten bit line structures is between about 0.15 to 0.20 uM.

Figure 7:
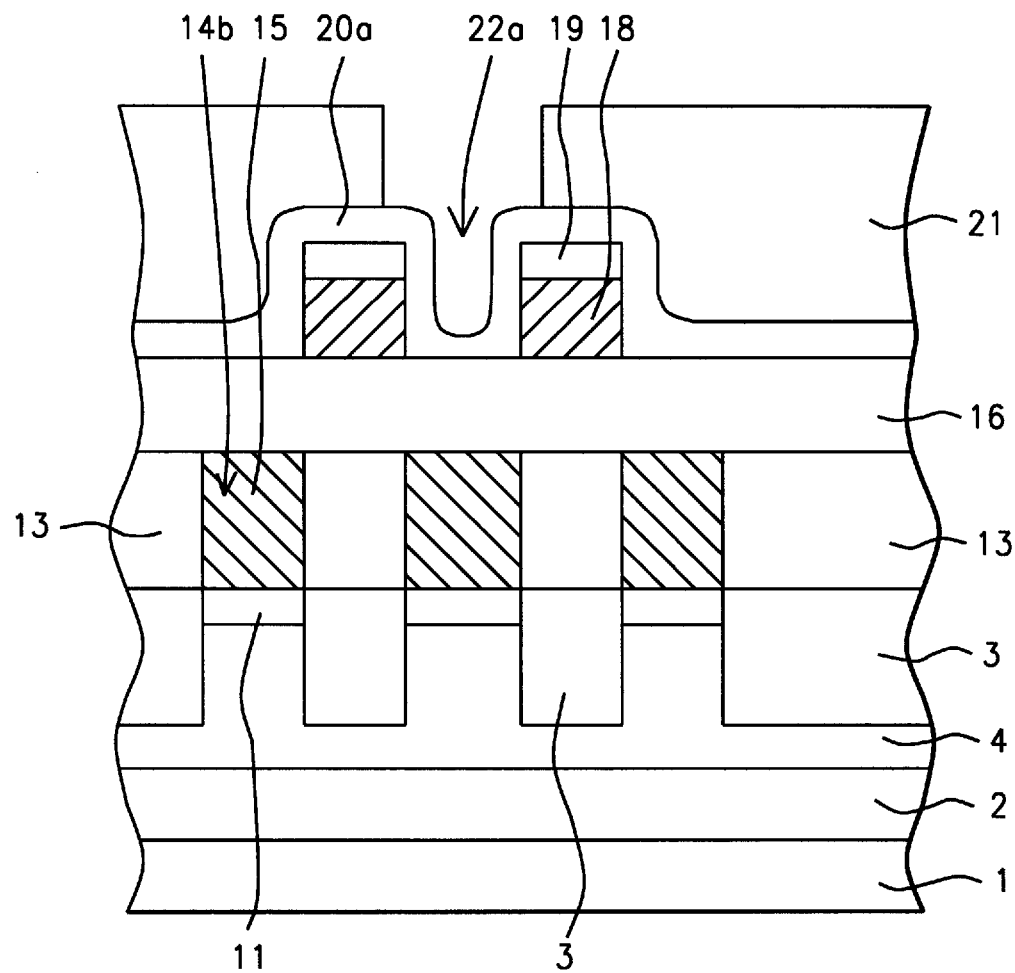
Figure 8:
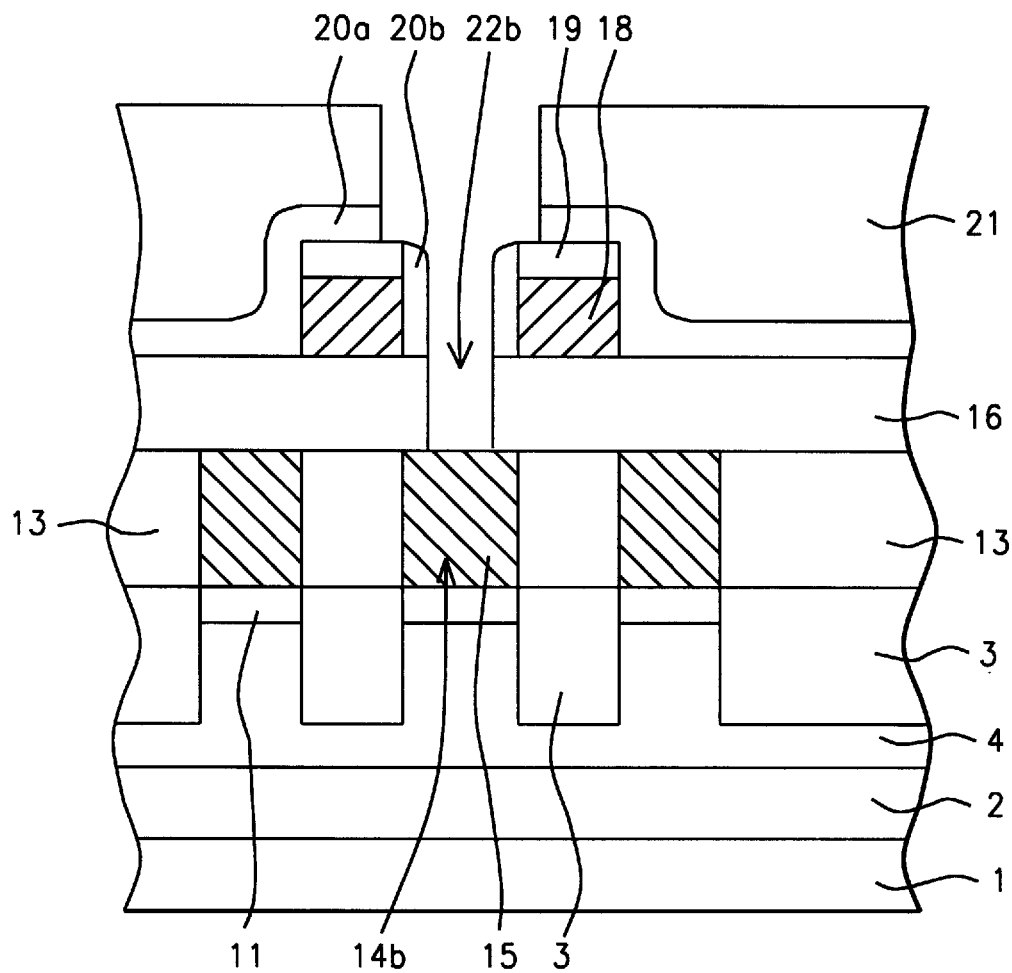

FIGS. 7 and 8, will next describe another SAC opening, between silicon nitride encapsulated, tungsten bit line structures 18, to be used to subsequently accommodate a capacitor node structure. A second silicon oxide layer 21, is deposited via PECVD procedures to a thickness between about 3000 to 5000 Angstroms. A photoresist shape, with an opening larger in width than the space between silicon nitride encapsulated, tungsten bit line structures, is used with a selective anisotropic RIE procedure, using $CF_4$—$C_2F_8$—$O_2$ as an etchant, to create SAC opening 22a, in second silicon oxide layer 16. This is schematically shown in FIG. 7. Next an anisotropic RIE procedure, using $CHF_3$ as an etchant, is used to form silicon nitride spacers 20b, on the sides of silicon nitride encapsulated, tungsten bit line structures 18. The anisotropic RIE procedure is continued, again using $CF_4$—$C_2F_8$—$O_2$ as an etchant for first silicon oxide layer 16, creating SAC opening 22b, exposing the top surface of a polysilicon plug 15, which in turn is contacting N type region 11, in semiconductor substrate 1. This is schematically shown in FIG. 8. SAC opening 22a, is opened to a width between about 0.05 to 0.14 uM, wider than the space between tungsten bit line structures, while SAC opening 22b, is the space between tungsten bit line structures.

Figure 9A:
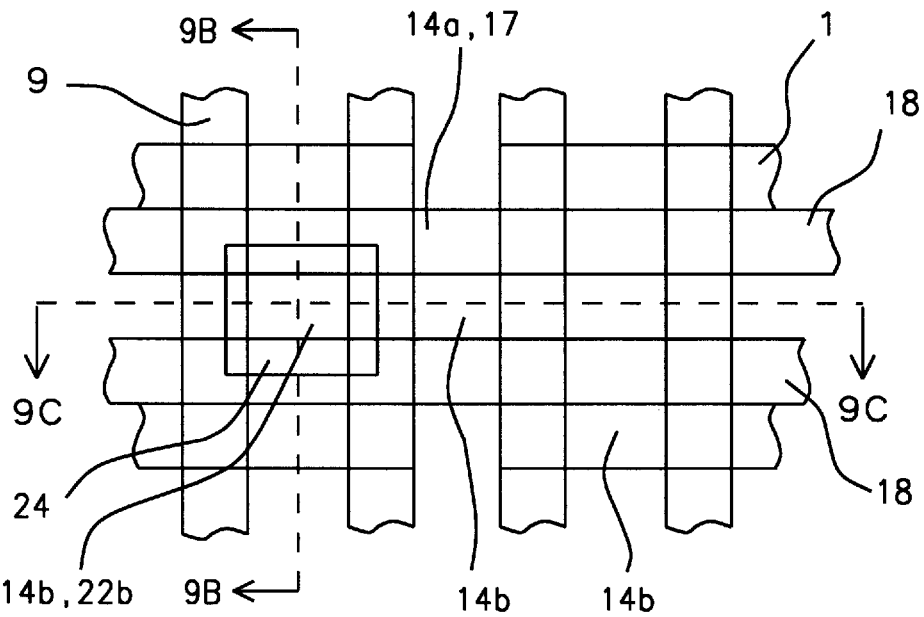
Figure 9B:
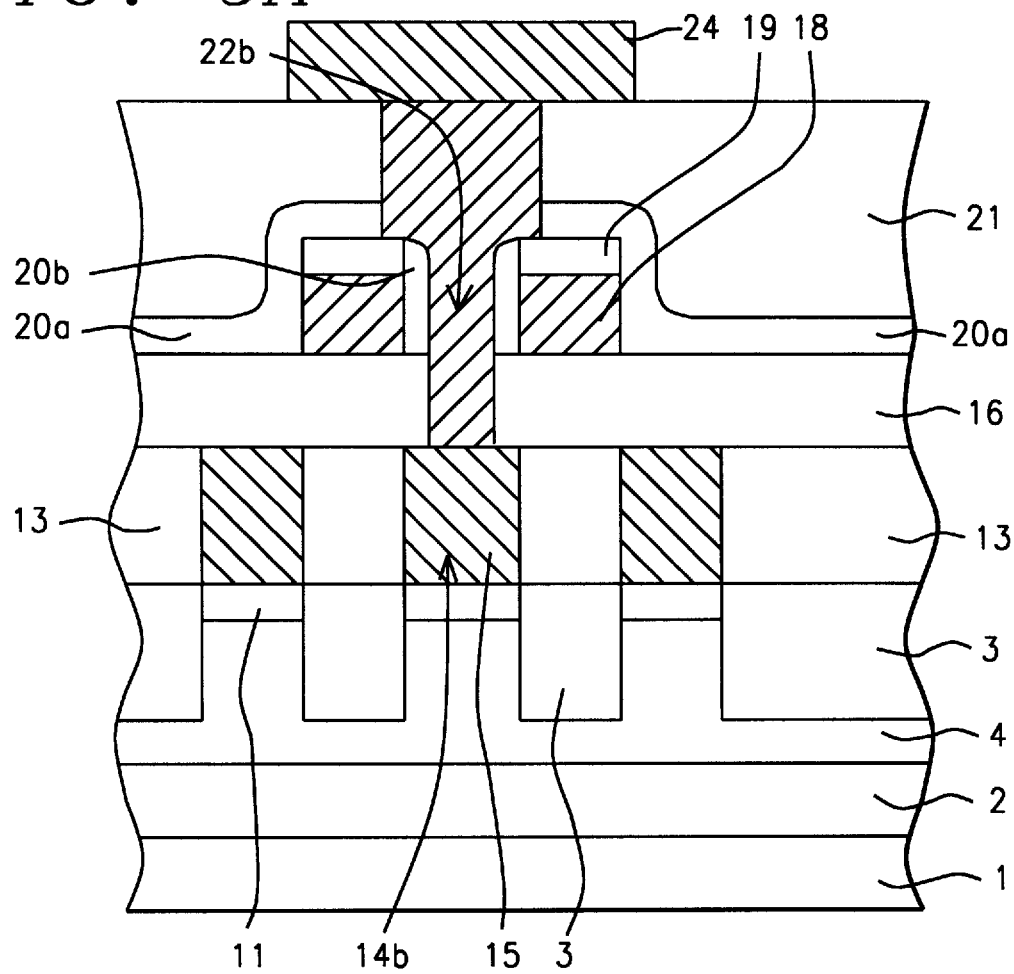
Figure 9C:
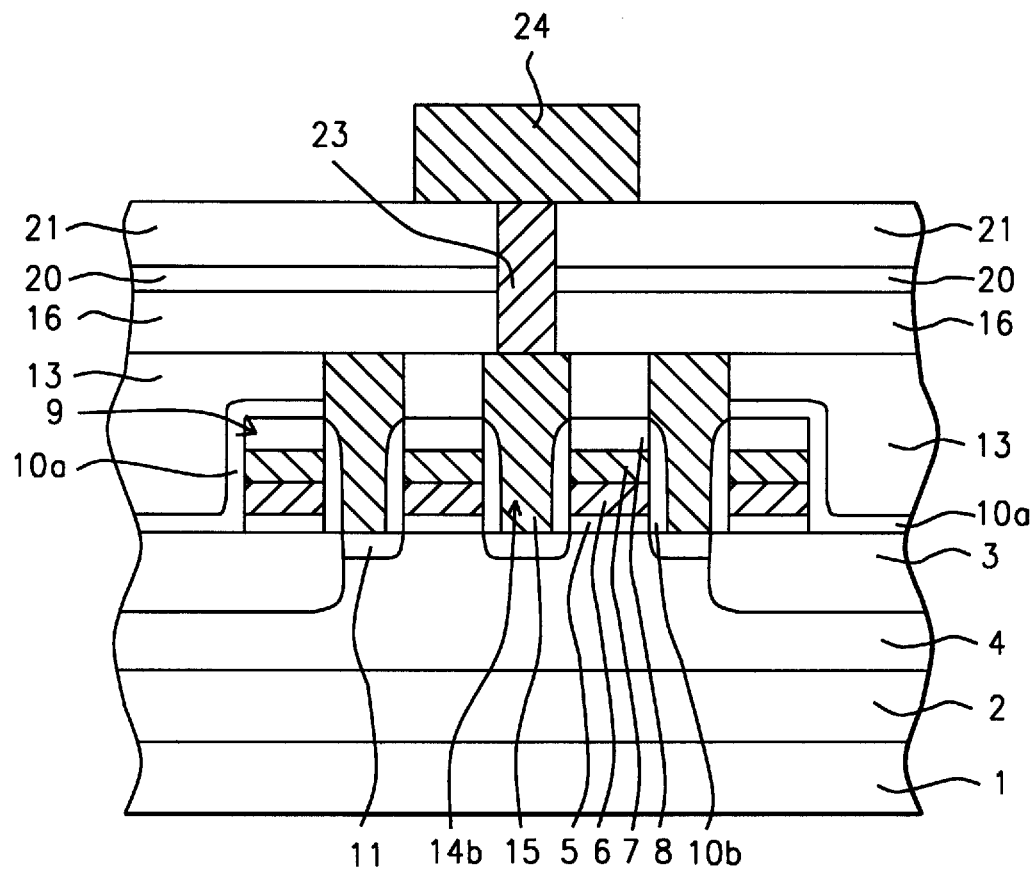

A polysilicon stud 23, is formed in SAC opening 22b, again via deposition of a doped polysilicon layer, followed by removal of unwanted polysilicon, via a CMP procedure. Polysilicon stud 23, is self-aligned to tungsten bit line structures 18, shown schematically in cross-sectional style in FIGS. 9B and 9C, and also self-aligned to polycide word lines 9. The self-alignment between polysilicon stud 23, and polycide word lines 9, can be seen in the top view of the DRAM cell, schematically shown in FIG. 9A. A capacitor structure 24, is next created, overlying and contacting polysilicon stud 23, which results in the self-alignment of the capacitor structure to both tungsten bit line structures 18, and polycide word lines 9. Capacitor structure 24, is formed by initially depositing, and doping, a polysilicon layer, followed by patterning of the polysilicon layer, to form the storage node of the capacitor structure. A titanium nitride, or tungsten nitride layer, and a capacitor dielectric layer of $Ta_2O_5$, are next deposited, with the capacitor dielectric layer at a equivalent silicon dioxide thickness between about 25 to 35 Angstroms. Another polysilicon layer is then deposited, doped, and patterned, to form the capacitor top plate for stacked capacitor structure 24. A titanium nitride or a tungsten nitride layer can be used in place of polysilicon layer, for creation of the capacitor plate. This is schematically shown in top view 9A, and cross-sectional views 9B and 9C. The DRAM cell is completed with additional insulator layers deposited, via hole openings made, and metal structures created, resulting in metal interconnect structures to underlying bit line structures, and semiconductor substrate regions. These steps are not shown in the drawings.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a DRAM cell, on a semiconductor substrate, comprising the steps of:

providing a N type region in said semiconductor substrate, to isolate said DRAM cell from said semiconductor substrate;

providing a P well region in said semiconductor substrate, to be used with N channel, MOSFET devices, in said DRAM cell;

forming a set of insulator filled shallow trenches, in said semiconductor substrate;

forming a gate insulator layer on regions of said semiconductor substrate, in regions not occupied by said insulator filled, shallow trenches;

forming polycide gate structures on said gate insulator layer, to be used as word lines for said DRAM cell, with said polycide gate structures capped with an overlying silicon nitride layer;

depositing a first silicon nitride layer;

depositing a first insulator layer;

opening first contact holes, in said first insulator layer, exposing said first silicon nitride layer, with said first silicon nitride overlying first regions of said semiconductor substrate;

opening a second contact hole, in said first insulator layer, exposing said first silicon nitride layer, with said first silicon nitride layer overlying a second region of said semiconductor substrate, and with said first silicon nitride layer overlying a first insulator filled shallow trench, from the set of said insulator filled shallow trenches, with said first insulator filled shallow trench, adjacent to said second region of said semiconductor substrate;

forming first silicon nitride spacers on the sides of polycide gate structures, exposed in said first contact hole, and exposed in said second contact hole;

forming N type regions in regions of said semiconductor substrate, exposed in said first contact hole, and exposed in said second contact hole;

forming a set of polysilicon plugs in said first contact hole, between, and self-aligned to, a first group of polycide gate structures, overlying, and contacting, a first group of said N type regions;

forming a first polysilicon plug in said second contact hole, between, and self-aligned to, a second group of polycide gate structures, overlying said first insulator filled shallow trench, and overlying and contacting, adjacent, a second N type region;

depositing a second insulator layer;

opening a third contact hole in said second insulator layer, exposing a region of said first polysilicon plug that overlays said first insulator filled shallow trench;

forming silicon nitride capped bit line structures, on the top surface of said second insulator layer, and with a silicon nitride capped bit line structure contacting the top surface of said first polysilicon plug, in said third contact hole;

depositing a second silicon nitride layer on said silicon nitride capped bit line structures;

depositing a third insulator layer;

opening a fourth contact hole, in said third insulator layer, between said silicon nitride capped bit line structures, exposing said second silicon nitride layer;

anisotropic etching of said second silicon nitride layer, to create second silicon nitride spacers, on the sides of said silicon nitride capped bit line structures, and exposing the top surface of said second insulator layer;

anisotropic etching of said second insulator layer, exposed in said fourth contact hole, creating an extended fourth contact hole, and exposing a second polysilicon plug, from the set of said polysilicon plugs, with said second polysilicon plug located between, and self-aligned to, said first group of polycide gate structures, and with said second polysilicon plug contacting an N type region;

forming a polysilicon stud, in said extended fourth contact hole, located between, and self-aligned to, said silicon nitride capped bit line structures, and contacting said second polysilicon plug; and forming a capacitor structure, on the top surface of said third insulator layer, overlying and contacting said polysilicon stud.

2. The method of claim 1, wherein said insulator filled shallow trenches, are formed in said semiconductor substrate to a depth between about 3000 to 5000 Angstroms, and filled with silicon oxide.

3. The method of claim 1, wherein said gate insulator layer is a thermally grown silicon dioxide layer, at thickness 50 to 70 Angstroms.

4. The method of claim 1, wherein said polycide gate structures are comprised of an overlying titanium disilicide layer, at a thickness between about 800 to 1200 Angstroms, and an underlying, N type, polysilicon layer, at a thickness between about 500 to 1000 Angstroms, with said polycide gate structure having a sheet resistance between about 2 to 4 ohms/square, with a space between polycide gate structures, of between about 0.18 to 0.20 uM.

5. The method of claim 1, wherein said first insulator layer is a boro-phosphosilicate layer, deposited using LPCVD or PECVD procedures, to a thickness between about 5000 to 7000 Angstroms.

6. The method of claim 1, wherein said first contact holes, are formed in said first insulator layer, via an anisotropic RIE procedure, using $CF_4$—$C_2O_8$—$CHF_3$ as an etchant, with said first contact hole having an opening between about 0.20 to 0.22 uM, in width.

7. The method of claim 1, wherein said N type regions are formed via ion implantation of arsenic or phosphorous, at an energy between about 30 to 50 KeV, at a dose between about 4E12 to 8E12 atoms/$cm^2$, and at an implant angle between about 30° to 45°.

8. The method of claim 1, wherein said polysilicon plugs, are N type, formed via deposition using an LPCVD procedure, and patterned using a chemical mechanical polishing procedure.

9. The method of claim 1, wherein said second insulator layer is silicon oxide, deposited via an LPCVD or a PECVD procedure, to a thickness between about 4000 to 6000 Angstroms.

10. The method of claim 1, wherein said bit line structures are comprised of tungsten layer, obtained via R.F. sputtering, at a thickness between about 800 to 1200 Angstroms, and patterned via an anisotropic RIE procedure, using $Cl_2$ as an etchant, resulting in a sheet resistance, for said bit line structure, between about 0.75 to 1.25 ohms/square.

11. The method of claim 1, wherein said third insulator layer is silicon oxide, deposited using a PECVD procedure, to a thickness between about 3000 to 5000 Angstroms.

12. The method of claim 1, wherein said second silicon nitride spacers, on the sides of said bit line structures, are formed via deposition of said first silicon nitride layer, to a thickness between about 300 to 500 Angstroms, followed by an anisotropic RIE procedure, using $CHF_3$ as an etchant.

13. The method of claim 1, wherein said capacitor structure is formed using a $Ta_2O_5$ dielectric layer, with an equivalent silicon oxide thickness between about 25 to 35 Angstroms.

14. A method for fabricating a high density DRAM cell, on a semiconductor substrate, with bit line structures self-aligned to word line structures, and with a capacitor node structure self-aligned to both bit line, and word line structures, comprising the steps of:

forming a P well region, in said semiconductor substrate;

forming a deep N type region, in said semiconductor substrate, isolating said DRAM cell from said semiconductor substrate;

forming shallow trenches in said semiconductor substrate;

forming a set of shallow trench isolation, (STI), regions, by filling said shallow trenches with an insulator layer;

growing a silicon dioxide gate insulator layer on said semiconductor substrate;

forming polycide gate structures, to be used as said word line structures, on said silicon dioxide gate insulator layer;

depositing a first silicon nitride layer;

depositing a boro-phosphosilicate, (BPSG), layer;

creating first self-aligned contact, (SAC), openings, in said BPSG layer, exposing said first silicon nitride layer, and with said first silicon nitride layer overlying a first region of said semiconductor substrate, with the first SAC opening located between a first group of word line structures;

creating a second SAC opening, in said BPSG layer, exposing said first silicon nitride layer, with said first silicon nitride layer overlying a second region of said semiconductor substrate, and overlying a first STI region, from the set of STI regions, with the second SAC opening, located, between a second group of word line structures;

forming first silicon nitride spacers on the sides of said polycide gate structures, exposed in said first SAC opening, and on the sides of said polycide gate structures, exposed in said second SAC opening;

forming N type regions, in areas of said semiconductor substrate, exposed in said first SAC openings, and in areas of said semiconductor substrate, exposed in said second SAC opening;

forming a set of polysilicon plugs, in said first SAC openings, between, and self-aligned to then first group of said word lines, and contacting the first group of said N type regions;

forming a first polysilicon plug, in said second SAC opening, between, and self-aligned to, the second group of said word line structures, and contacting said second N type region, and said first STI region;

depositing a first silicon oxide layer;

opening a first via hole in said first silicon oxide layer, exposing the top surface of said first polysilicon plug, in a region in which said first polysilicon plug overlays said first STI region;

depositing a tungsten layer;

depositing a second silicon nitride layer;

patterning of said second silicon nitride layer and of said tungsten layer, to create silicon nitride capped, tungsten bit line structures, on the top surface of said first silicon oxide layer, and with a tungsten bit line structure, contacting the top surface of said first polysilicon plug, in said first via hole;

depositing a third silicon nitride layer;

depositing a second silicon oxide layer;

forming a third SAC opening, in said second silicon oxide layer, between a group of tungsten bit line structure, exposing said third silicon nitride layer;

anisotropic etching of said third silicon nitride layer, to form second silicon nitride spacers, on the sides of the group of tungsten bit line structures; anisotropic etching of said first silicon oxide layer, exposed in said third SAC opening, creating an extended third SAC opening, exposing the top surface a second polysilicon plug, from the set of polysilicon plugs, with said second polysilicon plug, located between, and self-aligned to the first group of said word lines, and with said second polysilicon plug overlying and contacting an N type region;

forming a polysilicon stud in said extended third SAC opening, with said polysilicon stud, located between, and self-aligned to, said tungsten bit line structures;

forming a stacked capacitor structure, contacting the top surface of said polysilicon stud.

15. The method of claim 14, wherein said STI regions are formed in said semiconductor substrate to a depth between about 3000 to 5000 Angstroms, and filled with a LPCVD or PECVD silicon oxide layer.

16. The method of claim 14, wherein said silicon dioxide gate insulator layer, is thermally grown in an oxygen-steam ambient, to a thickness between about 50 to 70 Angstroms.

17. The method of claim 14, wherein said word line structures are polycide gate structures, comprised of an overlying layer of titanium disilicide, at a thickness between about 800 to 1200 Angstroms, and a underlying, doped polysilicon layer, at a thickness between about 500 to 1000 Angstroms, with said word line structures having a sheet resistance between about 2 to 4 ohms/square, and with the space between said word line structures, between about 0.18 to 0.20 uM.

18. The method of claim 14, wherein said first SAC opening is formed in said BPSG layer, via an anisotropic RIE procedure, using $CF_4$—$C_2F_8$—$CHF_3$ as an etchant, with said first SAC opening having a width between about 0.20 to 0.22 uM.

19. The method of claim 14, wherein said polysilicon plugs are formed from an N type polysilicon layer, deposited using an LPCVD procedure, and patterned using a CMP procedure.

20. The method of claim 14, wherein said tungsten bit line structures are formed via R.F. sputtering of a tungsten layer, to a thickness between about 800 to 1200 Angstroms, followed by patterning via an anisotropic RIE procedure, using $Cl_2$ as an etchant, resulting in said tungsten bit line structures with a sheet resistance between about 0.75 to 1.25 ohms/square, and with the space between said tungsten bit line structures, between about 0.15 to 0.20 Angstroms.

21. The method of claim 14, wherein said extended third SAC opening, is between about 0.05 to 0.14, wider in width than the space between said tungsten bit line structures.

22. The method of claim 14, wherein said capacitor structure is comprised of a polysilicon storage node, a $Ta_2O_5$ dielectric layer with an equivalent silicon dioxide thickness between about 25 to 35 Angstroms, and a polysilicon capacitor top plate.

* * * * *